United States Patent
Zhodzishsky et al.

(10) Patent No.: US 8,982,937 B1
(45) Date of Patent: *Mar. 17, 2015

(54) DIGITAL SYSTEM AND METHOD OF ESTIMATING NON-ENERGY PARAMETERS OF SIGNAL CARRIER

(71) Applicant: Topcon Positioning Systems, Inc., Livermore, CA (US)

(72) Inventors: Mark I. Zhodzishsky, Moscow (RU); Victor A. Prasolov, Moscow (RU); Vladimir V. Veitsel, Moscow (RU); Dmitry M. Zhodzishsky, Moscow (RU); Alexey S. Lebedinsky, Moscow (RU); Ilya V. Ivantsov, Moscow (RU)

(73) Assignee: Topcon Positioning Systems, Inc., Livermore, CA (US)

( * ) Notice: Subject to any disclaimer, the term of this patent is extended or adjusted under 35 U.S.C. 154(b) by 0 days.
This patent is subject to a terminal disclaimer.

(21) Appl. No.: 14/527,880

(22) Filed: Oct. 30, 2014

Related U.S. Application Data

(63) Continuation of application No. 14/117,091, filed as application No. PCT/RU2013/000543 on Jun. 26, 2013, now Pat. No. 8,891,687.

(51) Int. Cl.
*H03D 3/18* (2006.01)
*H03D 3/24* (2006.01)
*H04L 25/02* (2006.01)
*H04B 17/00* (2006.01)
*H04L 7/033* (2006.01)
*H03L 7/08* (2006.01)

(52) U.S. Cl.
CPC ............ *H04L 25/0262* (2013.01); *H04B 17/00* (2013.01); *H04L 7/0331* (2013.01); *H03L 7/08* (2013.01); *H03L 2207/50* (2013.01)
USPC ......................................................... 375/224

(58) Field of Classification Search
CPC ....... H03L 7/08; H03L 7/091; H03L 2207/50; H04B 17/21; H04B 17/00; H04L 25/0262; H04L 7/0331
See application file for complete search history.

(56) References Cited

U.S. PATENT DOCUMENTS

| 5,185,761 | A * | 2/1993 | Kawasaki | 375/130 |
|---|---|---|---|---|
| 6,311,129 | B1 * | 10/2001 | Lin | 701/472 |
| 6,493,378 | B1 * | 12/2002 | Zhodzishsky et al. | 375/149 |
| 6,650,187 | B1 * | 11/2003 | Riddle et al. | 331/17 |
| 7,133,469 | B2 * | 11/2006 | Kawai | 375/324 |
| 7,256,656 | B2 * | 8/2007 | Wu | 331/17 |
| 2011/0050998 | A1 * | 3/2011 | Gao et al. | 348/536 |
| 2012/0019296 | A1 * | 1/2012 | Pavlovic et al. | 327/158 |
| 2014/0072084 | A1 * | 3/2014 | Zhodzishsky et al. | 375/376 |

FOREIGN PATENT DOCUMENTS

SU    1026283    *    6/1983

OTHER PUBLICATIONS

Search Report in PCT/RU2013/000543, Mar. 12, 2014.*

* cited by examiner

*Primary Examiner* — Jean B Corrielus
(74) *Attorney, Agent, or Firm* — Bardmesser Law Group

(57) ABSTRACT

Navigation satellite receivers have a large number of channels, where phase discriminators and loop filter of a PLL operate in phase with data bits and control of numerically controlled oscillator (NCO) carried out simultaneously on all channels. Since symbol boundaries for different satellites do not match, there is a variable time delay between the generation of control signals and NCO control time. This delay may be measured by counting a number of samples in the delay interval. A proposed system measures non-energy parameters of the BPSK-signal carrier received in additive mixture with noise when a digital loop filter of PLL controls NCO with a constant or changing in time delay. A control unit controls bandwidth and a LF order by changing transfer coefficients based on analyzing estimated signal parameters and phase tracking error at a PD output.

14 Claims, 2 Drawing Sheets

DIGITAL SYSTEM AND METHOD OF ESTIMATING NON-ENERGY PARAMETERS OF SIGNAL CARRIER

CROSS REFERENCE TO RELATED APPLICATIONS

This application is a continuation of U.S. patent application Ser. No. 14/117,091, filed on 2013 Nov. 12 (now U.S. Pat. No. 8,891,687), which is a US National Phase of PCT/RU2013/000543, filed on 2013 Jun. 26, which are both incorporated by reference herein in their entirety.

BACKGROUND OF THE INVENTION

Phase, frequency and rate of change of frequency are parameters independent of energy of the input signal (i.e., they are non-energy parameters). There are conventional methods of estimating non-energy parameters of a signal based on processing of variables received from a phase locked loop (PLL).

A method and apparatus are used for estimating changing frequency of a signal received by a satellite receiver, see U.S. Pat. No. 7,222,035. The system includes a PLL having a numerically controlled oscillator (NCO) and a filter of frequency estimates (FFE). The PLL tracks the changing signal frequency and outputs non-smoothed frequency estimates into the FFE. The FFE then smoothes noise in the signal to produce a more accurate smoothed frequency estimate of the input signal.

Efficient detection and signal parameter estimation with application to high dynamic range GPS receivers, see U.S. Pat. No. 4,959,656. This publication describes an apparatus for obtaining estimates of signal parameters, such as carrier phase and frequency. The described system employs an adaptive Hilbert transform in a phase locked loop to estimate the parameters.

A system according to K. Sithamparanathan, Digital-PLL Assisted Frequency Estimation with Improved Error Variance, Create-Net Int. Res. Centre, Trento, IEEE Globecom, Nov. 30, 2008-Dec. 4, 2008, includes a PLL having NCO and a moving average filter (MAF) having N-samples length. The frequency estimates are produced by MAF using the frequency information contained in the phase error process of the digital PLL. The precision of frequency estimation when using this method is proportional to 1/N.

An apparatus and method described in U.S. Pat. No. 7,869,554 use a PLL and provide a phase estimation of the input signal from which signal frequency is estimated by a derivative function and low pass filtering.

A digital PLL described in U.S. Pat. No. 4,771,250 generates signal phase which is an approximation of the phase of a received signal with a linear estimator. The effect of a complication associated with non-zero transport delays related to the digital PLL is then compensated by a predictor. The estimator provides recursive estimates of phase, frequency, and higher order derivatives, while the predictor compensates for transport lag inherent in the loop.

K. De Brabandere et al., Design and Operation of a Phase-Locked Loop with Kalman Estimator-Based Filter for Single-Phase Applications, IEEE 2006, describes the design procedure of a Phase-Locked Loop (PLL) preceded by a Kalman estimator-based filter. It provides a highly accurate and fast estimate of the 50 Hz electrical grid frequency and phase angle in grid-connected power electronic applications. A Kalman filter is placed before the PLL in order to ensure that the PLL input matches an ideal sinusoidal waveform as closely as possible at all times, even when the voltage is highly distorted by the presence of harmonics. This ensures fast and low-distortion operation of the PLL for single-phase applications.

A method of measuring frequency for sinusoidal signals according to U.S. Pat. Publication No. 2011/0050998, published Aug. 31, 2009, entitled Digital Phase Lock Loop Configurable As A Frequency Estimator, provides for obtaining a current signal phase as an argument of the complex number, in-phase samples being a real part of the number, while the quadrature samples of quadrature signal decomposition components, converted into digital form and filtered, are the imaginary part of the number; receiving and storing a data block from sequential current differences in signal phases; generating a weight function in accordance with the given mathematical equations, which are used to estimate signal frequency.

However, the above methods provide measurements when there is no NCO control delay. The objective, therefore, is to obtain estimates of the input signal phase and its derivatives when there is a constant or changing in time delay of NCO control, and the addition of the control unit allows changing the bandwidth and the order of PLL to reduce fluctuation and dynamic errors.

SUMMARY OF THE INVENTION

Receivers of signals from navigation satellites (e.g., GPS, Galileo, etc.) have a large number of channels, in which the phase discriminators and loop filter of phase locked loop (PLL) operate in phase with the data bits and control numerically controlled oscillator (NCO) carried out simultaneously in all the channels. Since the boundaries of symbols for different satellites do not match, there is a variable time delay between generation of control signals and NCO control moment. This delay may be measured, for example, by counting the number of samples in the delay interval.

A delay meter measures of said delay of the NCO control wherein the loop filter (LF) and the estimate unit of non-energy signal parameters operates based on the measured delay. The system also includes a control unit that controls bandwidth and order of PLL by changing transfer coefficients of LF on the basis of analyzing the estimated signal parameters and signal at the output of the phase discriminator.

Accordingly, the present invention is related to a method and system for estimating the non-energy signal parameters using a controllable digital Phase Locked Loop that substantially obviates one or more of the disadvantages of the related art.

Additional features and advantages of the invention will be set forth in the description that follows, and in part will be apparent from the description, or may be learned by practice of the invention. The advantages of the invention will be realized and attained by the structure particularly pointed out in the written description and claims hereof as well as the appended drawings.

It is to be understood that the general description and the following detailed description are exemplary and explanatory and are intended to provide further explanation of the invention as claimed.

BRIEF DESCRIPTION OF THE ATTACHED FIGURES

The accompanying drawings, which are included to provide a further understanding of the invention and are incorporated in and constitute a part of this specification, illustrate embodiment of the invention and together with the description serve to explain the principles of the invention.

DETAILED DESCRIPTION OF THE PREFERRED EMBODIMENTS

Reference will now be made in detail to the preferred embodiments of the present invention, examples of which are illustrated in the accompanying drawings.

Figure 1:
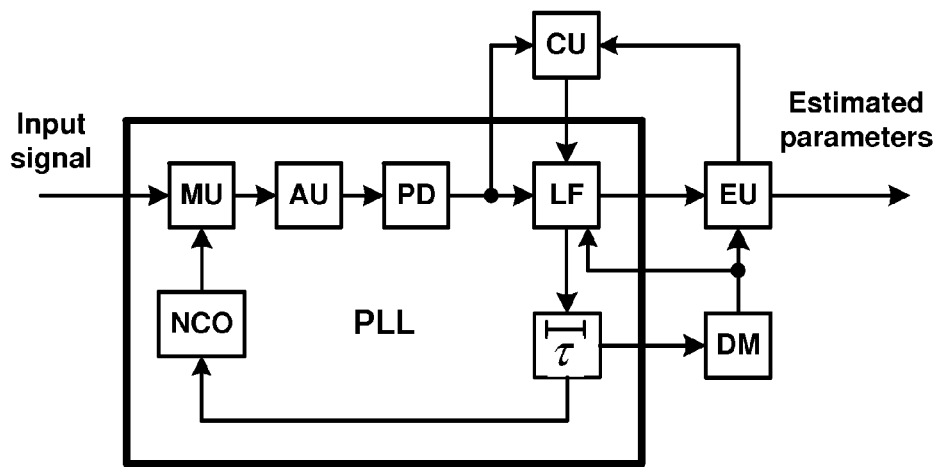
FIG. 1 is a functional block diagram for an embodiment of the invention.

FIG. 1 shows a functional block diagram for an embodiment of the invention.

The measuring system includes a digital PLL with a controllable loop filter (LF), a control unit (CU), a delay meter and an estimator unit (EU) of signal parameters. A digital PLL consists of the following primary components: a digital mixer, an accumulator unit (AU), a phase discriminator (PD), a controllable loop filter (LF), and a numerically controlled oscillator (NCO).

Let the input of the mixer unit receive digital samples of a real analog process $U_a(t)=U_c(t)+U_G(t)$ representing an additive mixture of Binary Phase Shift Key (BPSK)-signal $U_c(t)$ and noise $U_G(t)$. The desired signal $U_c(t)$ is equal to $$U_c(t)=A_c \cos [2\pi\phi_c(t)+D\cdot\pi]  \quad (1)$$

where $A_c$ is the amplitude of the signal, $\phi_c(t)=\int f_c(t)dt+\phi_0$ is the signal phase [in cycles], $f_c(t)$ is the signal frequency [Hz], $\phi_0(t)$ is the initial phase [in cycles], D is a data (+1 or −1).

Signal phase $\phi_c(t)$, signal frequency $f_c(t)$ and rate of change of frequency $\dot{f}_c(t)$ are the parameters that need to be estimated (measured).

Figure 2A:
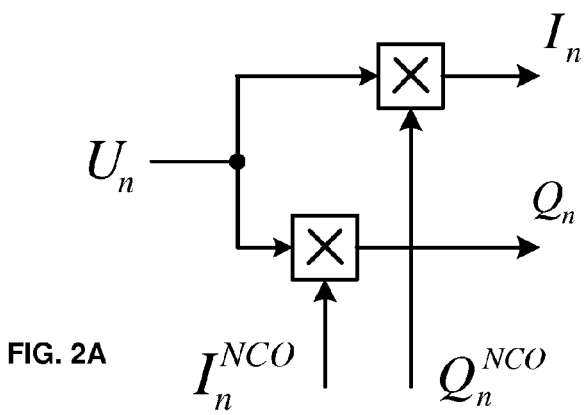
FIG. 2A is a functional block diagram of a mixer unit for a real input process.

Input samples $U_n=U_a(n\cdot T_s)$, where $T_s$ is the sampling period, n=0, 1, 2, . . . , are multiplied by digital samples of complex sinusoidal signal from NCO (FIG.-2A):

$$I_n^{NCO} = A_{NCO}\cos(2\pi\varphi_n^{NCO})  \quad (2)$$
$$Q_n^{NCO} = A_{NCO}\sin(2\pi\varphi_n^{NCO})$$

where $A_{NCO}$ is the amplitude of complex sinusoidal signal, and $\phi_n^{NCO}$ is phase in cycles. Multiplication results for a digitized real input signal is $$I_n = U_n \cdot I_n^{NCO}  \quad (3)$$
$$Q_n = U_n \cdot Q_n^{NCO}$$

Figure 2B:
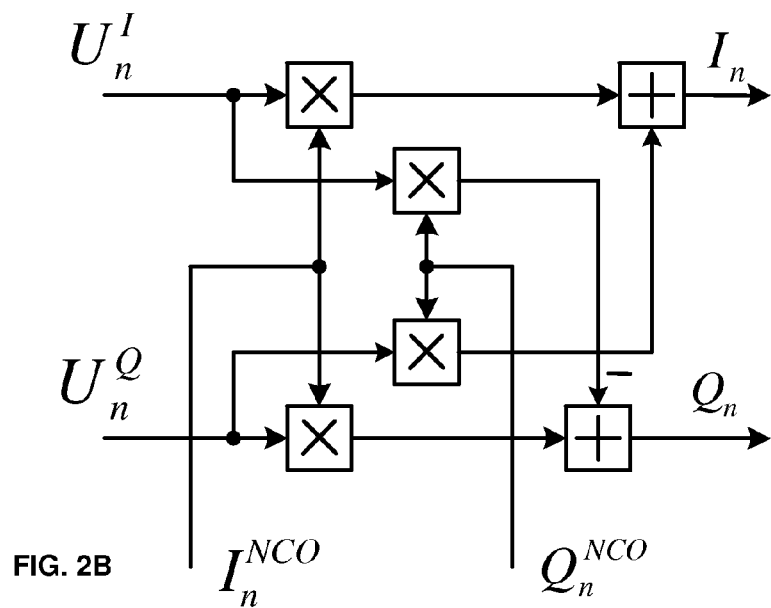
FIG. 2B is a functional block diagram of a mixer unit for a complex input process.

For a digitized complex input signal $(U_n^I, U_n^Q)$, the mixer (FIG. 2B) operates based on equation:

$$I_n = U_n^I \cdot I_n^{NCO} + U_n^Q \cdot Q_n^{NCO}  \quad (4)$$
$$Q_n = U_n^Q \cdot I_n^{NCO} - U_n^I \cdot Q_n^{NCO}$$

Figure 3:
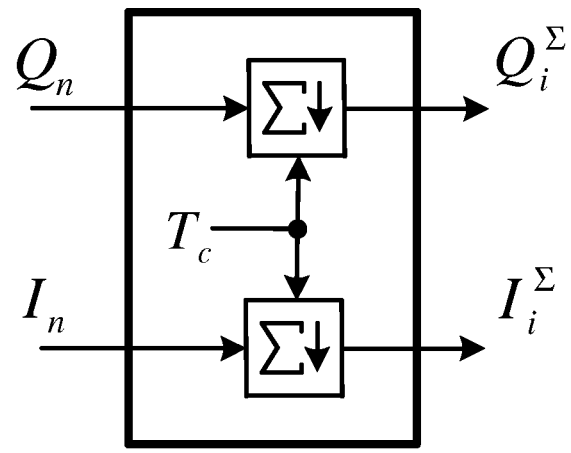
FIG. 3 is a functional block diagram of an accumulator unit.
Figure 4:
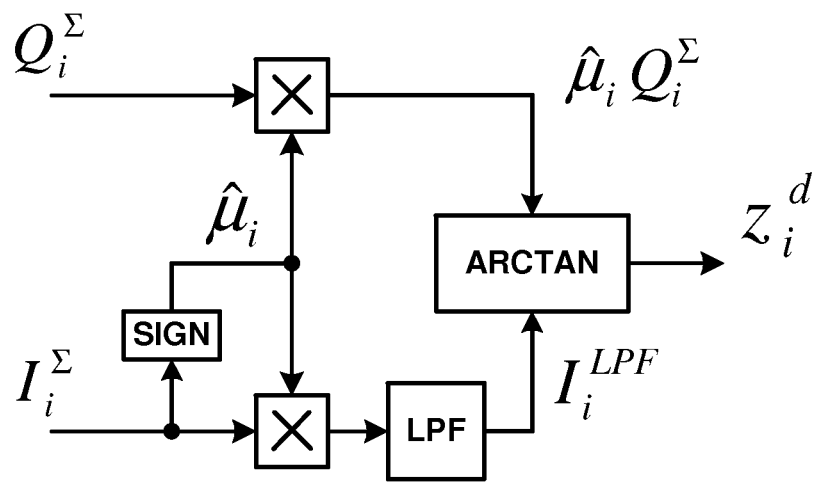
FIG. 4 is a functional block diagram of a phase discriminator.

The samples $I_n$ and $Q_n$ are fed to the inputs of an accumulators unit (AU) with reset to the period $T_c$(FIG. 3) which is synchronized with the boundaries of binary symbols and equal to the symbol duration. The reset period of accumulators $T_c$ is the control period in the PLL. The generated complex samples $(I_i^\Sigma, Q_i^\Sigma)$ at the outputs of the accumulators unit are fed to the inputs of the phase discriminator producing signal $z_i^d$ e.g., as shown in FIG. 4. The phase discriminator contains a determinant of the symbol character $\hat{\mu}_i$ (sign), a low-pass filter (LPF) smoothing an in-phase component $I_i^s$ from output of the accumulator with reset multiplied by $\hat{\mu}_i$ that is $\hat{\mu}_i \cdot I_i^\Sigma$ and $z_i^d$ is calculated based on equation:

$$z_i^d = \text{arctg}(\hat{\mu}_i \cdot Q_i^\Sigma / I_i^{LPF})  \quad (5)$$

where $Q_i^\Sigma$—a quadrature component from output of the accumulator with reset, $I_i^{LPF}$ is a LPF output.

Signal $z_i^d$ from the PD output comes to the controllable digital loop filter (LF) that controls the NCO, wherein there may be a constant or a changing time delay of NCO control.

At the beginning of operation, the order of the loop filter is set considering a priori information about a movement pattern.

By analyzing $z_i^d$ at the output of the PD and estimated parameters the control unit changes the loop filter bandwidth and the loop filter order by changing transfer coefficients.

The control unit changes the loop filter bandwidth by varying auxiliary variable $k_i (k_{min} \leq k_i \leq k_{max})$ that is used for calculation of LF transfer coefficients based on the following equations:

in a first-order loop filter $k_{min}=1$ $$\alpha_i = 1/(k_i+1)  \quad (6)$$

in a second-order loop filter $k_{min}=2$ $$\alpha_i = \frac{6}{(k_i+1)} - \frac{2}{k_i}  \quad (7)$$
$$\beta_i = \frac{6}{k_i(k_i+1)}$$

in a third-order loop filter $k_{min}=3$ $$\alpha_i = (9 \cdot k_i^2 - 9 \cdot k_i + 6)/D  \quad (8)$$
$$\beta_i = (36 \cdot k_i - 18)/D$$
$$\gamma_i = 60/D$$

where $$D = k_i^3 + 3 \cdot k_i^2 + 2 \cdot k_i  \quad (9)$$

From equations (6)-(9) it follows that as variable $k_i$ increases, LF transfer coefficients decreases, and hence the bandwidth reduces as well. And otherwise, as variable $k_i$ decreases, LF bandwidth increases. Value $k_i=k_{max}$ corresponds to the minimum bandwidth of PLL.

A delay meter (DM) measures delay τ of the NCO control wherein the loop filter and the estimate unit operates based on the measured delay. Signal $z_i^d$ from the PD output and measured delay z comes to the controllable digital loop filter (LF). The third order loop filter with transfer gains $\alpha_i, \beta_i, \gamma_i$, described by the following recurrence equations a) and b), where $$v = \tau/T_c,$$

$$q_i \equiv z_i^d - v \cdot (\varphi_{i-1+v}^{NCO} - \varphi_{i-2+v}^{NCO}) + \frac{v^2}{2} \cdot g_{i-1+v}^{NCO} + \frac{(2-v) \cdot v}{2} \cdot g_{i-2+v}^{NCO} - \frac{v^2}{2} \cdot \hat{s}_{i-1}$$

$$z_{i+v}^q \equiv \left[\alpha_i + \frac{(1+2 \cdot v)}{2} \cdot \beta_i + \frac{v \cdot (1+v)}{2} \cdot \gamma_i\right] \cdot q_i$$

a) for the case of frequency controlled NCO $$\left.\begin{array}{l}\varphi_{i+v}^{NCO} = \varphi_{i-1+v}^{NCO} + g_{i-1+v}^{NCO} \\ g_{i+v}^{NCO} = g_{i-1+v}^{NCO} + s_{i-1} + [\beta_i + (1+v) \cdot \gamma_i] \cdot q_i + z_{i+v}^q \\ s_i = s_{i-1} + \gamma_i \cdot q_i \\ z_{i+v}^\omega = g_{i+v}^{NCO}/(T_c \cdot \Delta_f^{NCO})\end{array}\right\}, \quad (10)$$

b) for the case of frequency-phase controlled NCO $$\left.\begin{array}{l}\varphi_{i+v}^{NCO} = \varphi_{i-1+v}^{NCO} + g_{i-1+v}^{NCO} + z_{i+v}^q \\ g_{i+v}^{NCO} = g_{i-1+v}^{NCO} + s_{i-1} + [\beta_i + (1+v) \cdot \gamma_i] \cdot q_i \\ s_i = s_{i-1} + \gamma_i \cdot q_i \\ z_{i+v}^\varphi = z_{i+v}^q/\Delta_\varphi^{NCO} \\ z_{i+v}^\omega = g_{i+v}^{NCO}/(T_c \cdot \Delta_f^{NCO})\end{array}\right\} \quad (11)$$

Digital phase samples $Z_{i+v}^\varphi$ (phase codes) are fed to the NCO phase control input and abruptly change its phase by the corresponding value (in radian) $Z_{i+v}^{NCO} = Z_{i+v}^\varphi \cdot \Delta_\varphi^{NCO}$, where $\Delta_\varphi^{NCO}$ is the phase step size (in radian) in the NCO. Samples $Z_{i+v}^\omega$ (frequency codes) are delivered to the NCO frequency input and determine its frequency $\omega_{i+v}^{NCO} = z_{i+v}^\omega \cdot \Delta_\omega^{NCO}$ (in radians), where $\Delta_\omega^{NCO}$ is the frequency step size (in radians) in the NCO. Since NCO frequency is constant over the entire interval $T_c$, NCO phase changes linearly on intervals $T_c$.

An estimator unit connected to the loop filter estimates a received signal phase $\hat{\varphi}_i^c$ (radian) and its derivatives–frequency $\hat{\omega}_i^c$ (radians) and a changing rate of the input signal frequency $\hat{\dot{\omega}}_i^c$ (radian/s²) in accordance with the following recurrence equation:

$$\left.\begin{array}{l}\hat{\varphi}_i^c = \varphi_{i+v}^{NCO} - g_{i+v}^{NCO} \cdot v + \frac{1}{2} \cdot s_i \cdot \left[v^2 + v + \frac{1}{6}\right] \\ \hat{\omega}_i^c = \omega_{i+v}^c - s_i \cdot \left(v + \frac{1}{2}\right)/T_c \\ \hat{\dot{\omega}}_i^c = s_i/T_c^2\end{array}\right\} \quad (12)$$

At $\gamma_i 0$ the order of the loop filter will be second, and if $\beta_i=0$ as well, LF will be a first-order filter.

If $|z_i^d|$ at the PD output does not exceed the preset threshold $z_{thr}^d > 0$, the control block reduces LF bandwidth by increasing variable $k_i$ by $\Delta_k$, and thereby reducing fluctuation errors of estimates for the signal parameters, i.e.:

if $|Z_i^d| \leq z_{thr}^d$, then $$k_i = k_{i-1} + \Delta_k, \quad (13)$$

where $\Delta_k > 0$ if the obtained value $$k_i > k_{max} \text{ then } k_i = k_{max} \quad (14)$$

The threshold $z_{thr}^d$ is selected based on compromise considerations: too high threshold means the adaptation process will be long, and will have errors in the estimate during rapid changes in the input, while too low value will lead to a worse estimate during operation that is close to steady state.

If value $|z_i^d|$ at the PD output exceeds the preset threshold $z_{thr}^d$, and the order of the loop filter $N^{LF}$ is less than maximum preset value $N_{max}^{LF}$, the control unit increases by 1 the order of the loop filter to reduce dynamic errors. The order of the loop filter is usually chosen as $N^{LF} \leq 4$. If value $|z_i^d|$ at the PD output exceeds the preset threshold $z_{thr}^d$, and the order of the loop filter $N^{LF}$ is equal to the maximum preset value $N_{max}^{LF}$, the control block increases the LF bandwidth to reduce dynamic errors, i.e.

if $$|z_i^d| > z_{thr}^d \text{ then } k_i = k_{i-1}/r \text{ where } r > 1 \quad (15)$$

if the obtained value $$k_i < k_{min}, \text{ then } k_i = k_{min} \quad (16)$$

Typical values are $1 < r < 4$.

Having thus described the invention, it should be apparent to those skilled in the art that certain advantages of the described method and apparatus have been achieved.

It should also be appreciated that various modifications, adaptations, and alternative embodiments thereof may be made within the scope and spirit of the present invention. The invention is further defined by the following claims.

What is claimed is:

1. A system for estimating parameters of an input signal, the system comprising:
   a digital phase locked loop (PLL) that includes
   (i) a digital numerically controlled oscillator (NCO) configured to generate a complex sinusoidal signal,
   (ii) a digital mixer configured to convert a digitized version of the input signal to a base-band signal centered at a zero frequency using the output of the NCO,
   (iii) an accumulator unit (AU) including two accumulators with a reset connected to the digital mixer,
   (iv) a phase discriminator (PD) coupled to the AU; and
   (v) a digital loop filter (LF) connected to an output of the PD for controlling the NCO, wherein a time delay of the output of the PD is variable;
   an estimator unit (EU) connected to the LF and estimating a phase of the input signal and derivatives of the phase as the parameters; and
   a delay circuit measuring a delay of the output of the PD and providing the delay to the LF and EU.

2. The system of claim 1, further comprising a bandwidth controller that controls bandwidth of the PLL and an order of the LF by changing transfer coefficients of the LF based on analyzing the PD output and the estimated signal parameters.

3. A system for estimating non-energy parameters of a signal carrier, the system comprising:
   a digital phase locked loop (PLL) that tracks an input signal and includes
   (i) a digital numerically controlled oscillator (NCO) configured to generate a sinusoidal signal,
   (ii) a digital mixer configured to down-convert a digitized version of the input signal to a base-band signal centered at a zero frequency using the sinusoidal signal, (iii) an accumulator unit (AU) including two accumulators with a reset connected to the digital mixer, and (iv) a phase discriminator (PD) coupled to outputs of the AU;

(v) a digital loop filter (LF) connected to the PD output for controlling the NCO;

an estimator unit (EU) connected to the LF and estimating a phase of the input signal and a derivative of the phase as the non-energy parameters; and a bandwidth controller that controls PLL bandwidth and an order of the LF by changing transfer coefficients of the LF based on the PD output and the estimated non-energy signal parameters.

4. The system of claim 3, wherein initial values of the PLL bandwidth and of the LF order are set based on motion of the system.

5. The system of claim 3, wherein fluctuation errors of the estimated signal parameters are reduced by making a bandwidth of the LF fade down from a maximum value to a minimum value or until the PD output exceeds a preset threshold.

6. The system of claim 5, wherein the order of the LF is equal to a maximum preset order, the bandwidth controller expands the bandwidth of the LF when the PD output exceeds the preset threshold, to thereby reduce dynamic errors of estimated non-energy signal parameters.

7. The system of claim 3, wherein the bandwidth controller sets a reduced order of the LF such that a bandwidth of the LF does not change substantially despite order change.

8. The system of claim 3, wherein the bandwidth controller analyzes the estimate of the N-th signal phase derivative at the N-th order LF($N^{LF} \neq 1$) and reduces an order of the LF by 1 if the estimate value is less than 5 standard deviations of the estimate of the ($N^{LF}-1$)-th signal phase derivative.

9. The system of claim 3, wherein the bandwidth controller increases an order of the LF when the PD output exceeds a preset threshold.

10. The system of claim 3, wherein the bandwidth controller controls a bandwidth of the PLL by changing transfer coefficients of the LF and calculating a parameter $k_{min} \leq k_i \leq k_{max}$ that are used to calculate transmission coefficients of the LF based on equations:

in a first-order adaptive filter $k_{min}=1$ $$\alpha_i = 1/(k_i+1),$$

in a second-order adaptive filter $k_{min}=2$ $$\left.\begin{array}{l}\alpha_i = \dfrac{4k_i+1}{k_i(k_i+1)} \\ \beta_i = \dfrac{6}{k_i(k_i+1)}\end{array}\right\},$$

in a third-order adaptive filter $k_{min}=3$ $$\left.\begin{array}{l}\alpha_i = (9 \cdot k_i^2 + 9 \cdot k_i - 3)/D \\ \beta_i = (36 \cdot k_i + 42)/D \\ \gamma_i = 60/D\end{array}\right\},$$

where $D=k_i^3+3 \cdot k_i^2+2 \cdot k_i$ and $k_{max} \gg 1$.

11. The system of claim 3, wherein the bandwidth controller narrows bandwidth of the PLL according to $k_i=k_{i-1}+\Delta_k$, where $\Delta_k>0$, if the PD output is below a predetermined threshold.

12. The system of claim 3, wherein the bandwidth controller expands bandwidth of the PLL according to $k_i=k_{i-1}/r$, where $r>1$, if the PD output exceeds assigned a predetermined threshold and when a current order of the LF is equal to a maximum preset order, and when $k_i<k_{min}$ then $k_i=k_{min}$.

13. The system of claim 3, wherein the bandwidth controller changes an order of the PLL such that the transfer coefficients of the LF change but a bandwidth of the LF is substantially unchanged.

14. The system of claim 3, wherein a time delay of the PD output is variable.

* * * * *